United States Patent

Kitajima et al.

[11] Patent Number: 5,833,831
[45] Date of Patent: Nov. 10, 1998

[54] METHOD AND SYSTEM FOR GENERATING ELECTROLYZED WATER

[75] Inventors: Hiroshi Kitajima; Hidemitsu Aoki, both of Tokyo, Japan

[73] Assignee: NEC Corporation, Tokyo, Japan

[21] Appl. No.: 798,716

[22] Filed: Feb. 12, 1997

Related U.S. Application Data

[63] Continuation of Ser. No. 409,455, Mar. 24, 1995, abandoned.

[30] Foreign Application Priority Data

Mar. 25, 1994 [JP] Japan ................................. 6-056111

[51] Int. Cl.$^6$ .............................. C25B 15/00; C25B 1/00
[52] U.S. Cl. ........................................... 205/349; 205/464
[58] Field of Search ..................................... 205/349, 464

[56] References Cited

U.S. PATENT DOCUMENTS 4,057,474  11/1977  Kurtz et al. ................................ 204/98
4,810,344   3/1989  Okazaki .................................... 204/228
4,867,856   9/1989  Okazaki .................................... 204/260

FOREIGN PATENT DOCUMENTS 0 627 386  12/1994  European Pat. Off. .
1 543 249   3/1979  United Kingdom .
  2014610   8/1979  United Kingdom ................... 205/349

OTHER PUBLICATIONS

Derwent Abstract Accession No. 95–040533/06.

Derwent Abstract Accession No. C92–141814.

*Primary Examiner*—Kathryn L. Gorgos
*Attorney, Agent, or Firm*—Young & Thompson

[57] ABSTRACT

In a method for generating electrolyzed water, pre-electrolyzed solution is added in water to be electrolyzed at least at the beginning of electrolyzing processing.

10 Claims, 11 Drawing Sheets

METHOD AND SYSTEM FOR GENERATING ELECTROLYZED WATER

This application is a continuation of application Ser. No. 08/409,455, filed Mar. 24, 1995, now abandoned.

FIELD OF THE INVENTION

The invention relates to a method and a system for generating electrolyzed water, which is used especially for wet treatment of semiconductor devices, such as cleaning, rinsing and etching of semiconductor substrates.

BACKGROUND OF THE INVENTION

In wet-processing of semiconductor devices, a large amount of chemical material of high concentration has been used. It is necessary to reduce the amount of such of chemical material for cost and solution, and it can be applied to wet-processing of semiconductor devices. Active water, generated by electrolyzing pure water or solution, has been used for cleaning semiconductor substrates, and the like. One example of such a system, "Redox" type of cleaning method, is described in a magazine "Cleaning Design," on page 1, 1987 Spring, published by Kindai Hensyu-Sha. The system is not appropriate to be added to electrolyte for electrolyzing pure water, because the active water generated by this system is not stable.

On the other hand, another conventional system has been proposed, which includes twin electrolyzing cells for anode and cathode. For improving efficiency of electrolysis of water, however, it is necessary to provide a high voltage power supply or add more chemical electrolyte to the water. The amount of chemical electrolyte should be decreased.

SUMMARY OF THE INVENTION

Accordingly, an object of the invention is to provide an improved method by which electrolyzed water can be generated efficiently and stably.

Another object of the invention is to provide an improved method by which electrolyzed water can be generated without adding electrolyte material to the water.

Another object of the invention is to provide an improved system by which electrolyzed water can be generated stably and efficiently.

Another object of the invention is to provide an improved system by which electrolyzed water can be generated without adding electrolyte material to the water to be electrolyzed.

According to the invention, electrolyzed water is generated by using pre-electrolyzed water. That is, according to an aspect of the invention, a method for generating electrolyzed water uses the steps of: providing water in a container; then electrolyzing the water; and adding pre-electrolyzed solution to the water at least at the beginning of the electrolyzing step.

According to another aspect of the invention, a system for generating electrolyzed water includes a container separated by a diaphragm into anode and cathode cells, an anode electrode located in the anode cell, a cathode electrode located in the cathode cell, a DC (Direct Current) power supply connected to the anode and cathode electrodes, a first anode input port connected to the anode cell for supplying water therein, a first cathode input port connected to the cathode cell for supplying water therein, a second anode input port connected to the anode cell for supplying pre-electrolyzed water therein at least at the beginning of electrolysis treatment, a second cathode input port connected to the anode cell for supplying pre-electrolyzed water therein, an anode output port connected to the anode cell for outputting the water electrolyzed in the anode cell, and a cathode output port connected to the cathode cell for outputting the water electrolyzed in the cathode cell. Preferably, the system further includes an anode circulation system connected to the anode output port for circulating some of the water electrolyzed in the anode cell to the second anode input port so as to use the circulated water as the pre-electrolyzed water; and a cathode circulation system connected to the cathode output port for circulating some of the water electrolyzed in the cathode cell to the second cathode input port so as to use the circulated water as the pre-electrolyzed water. The container may be separated into a plurality of anode cells and a plurality of cathode cells, wherein the anode and cathode cells are arranged alternately.

According to another aspect of the invention, a system for generating electrolyzed water includes a container separated by a diaphragm into anode and cathode cells, into which water to be electrolyzed is supplied; upper and lower anode electrodes arranged in the anode cell; upper and lower cathode electrodes arranged in the cathode cell; a first DC (Direct Current) power supply connected to the upper anode and upper cathode electrodes; and a second DC power supply connected to the lower anode and lower cathode electrodes. Preferably, in the system, the upper anode and upper cathode are arranged to have a larger distance from the diaphragm than that of the lower anode and cathode electrodes from the diaphragm.

DESCRIPTION OF THE PREFERRED EMBODIMENTS

Figure 1:
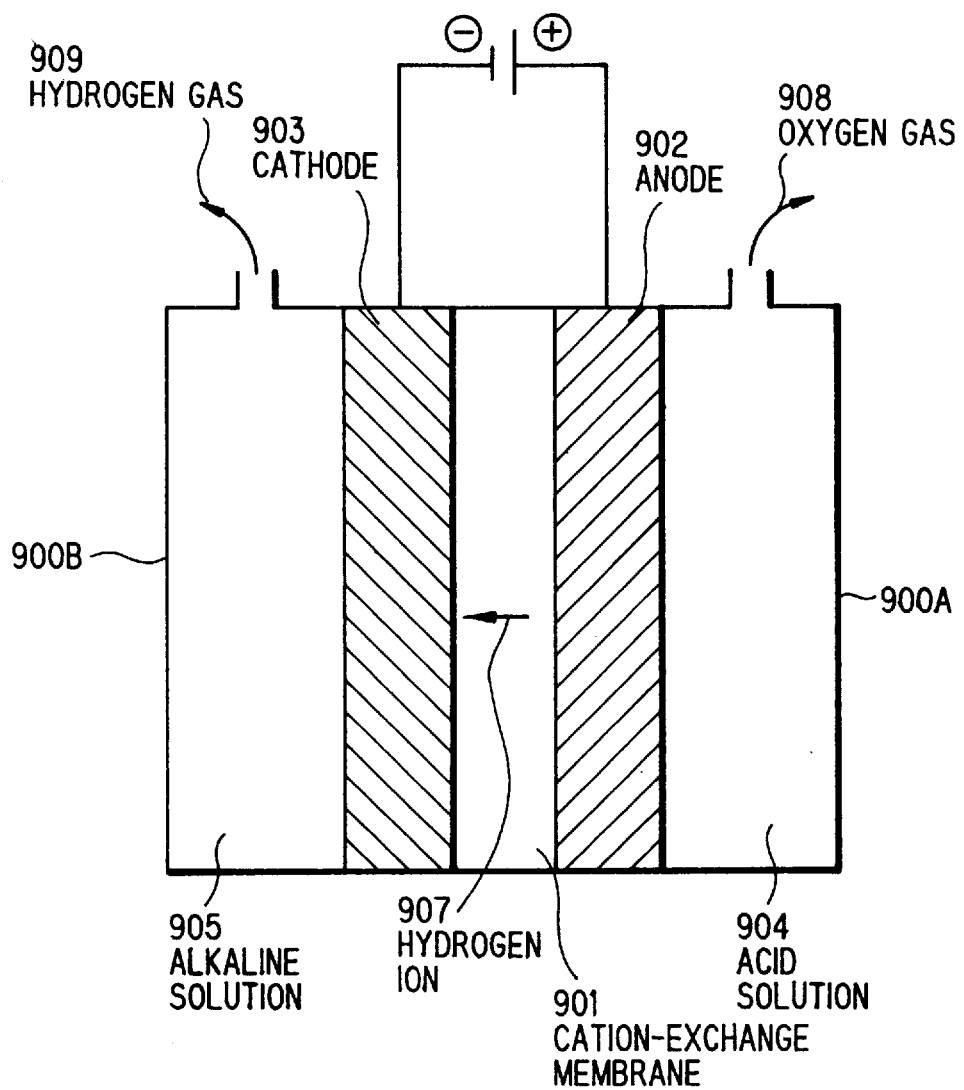
FIG. 1 is an explanatory diagram showing a conventional system for generating electrolyzed water.

For better understanding of the invention, a conventional technology is first described. FIG. 1 shows a conventional system for generating electrolyzed water, including an anode cell 900A, a cathode cell 900B, an anode electrode 902 of platinum put in the anode cell 900A, a cathode electrode 903 of platinum or carbon put in the cathode cell 900B, a cation-exchange membrane 901, and a DC power supply 906. This system was first made by GE (General Electric) in 1970. The cation-exchange membrane 901 is held by the anode and cathode electrodes 902 and 903 from both sides. Pure water is supplied into the anode and cathode cells 900A and 900B, so that the water is electrolyzed to generate acid solution 904 and alkaline solution 905, respectively. Each of the anode and cathode 902 and 903 is shaped like a net so that the electrodes are filled with water.

In operation, when the DC power supply applies direct voltage to the anode and cathode 902 and 903, hydrogen ion 907 is moved in the cation-exchange membrane 901, so that current flows between the electrodes 902 and 903. By the flowing of the current, oxidation and reduction is carried out in the anode and cathode cells 900A and 900B, respectively. In the anode cell 900A, the following phenomenon occurs, and oxygen gas 908 is generated:

$2H_2O \rightarrow 4H^+ + O_2 + 4e^-$ (Acidic Condition)

$2OH^- \rightarrow 2H_2O + O_2 + 4e^-$ (Alkalinity Condition)

As understood from the above formulas, water in the anode cell 900A becomes acidic because of the reduction of $OH^-$ or the increasing of $H^+$.

On the other hand, in the cathode cell 900B, the following reduction occurs:

$2H^+ + 2e^- \rightarrow H_2$ (Acidic Condition)

$2H_2O + 2e^- \rightarrow H_2 + 2OH^-$ (Alkalinity Condition)

The reduction reaction makes hydrogen gas 909, and the water becomes alkaline due to the reduction of $H^+$ or increasing of the $OH^-$. The above described conventional system is appropriate for generating oxygen gas or hydrogen gas; however, it takes a long time to obtain stable characteristics, such as the concentration of ions, when water is electrolyzed with electrolyte. There is another type of system using electrolyte which decreases the resistance of water.

Figure 2:
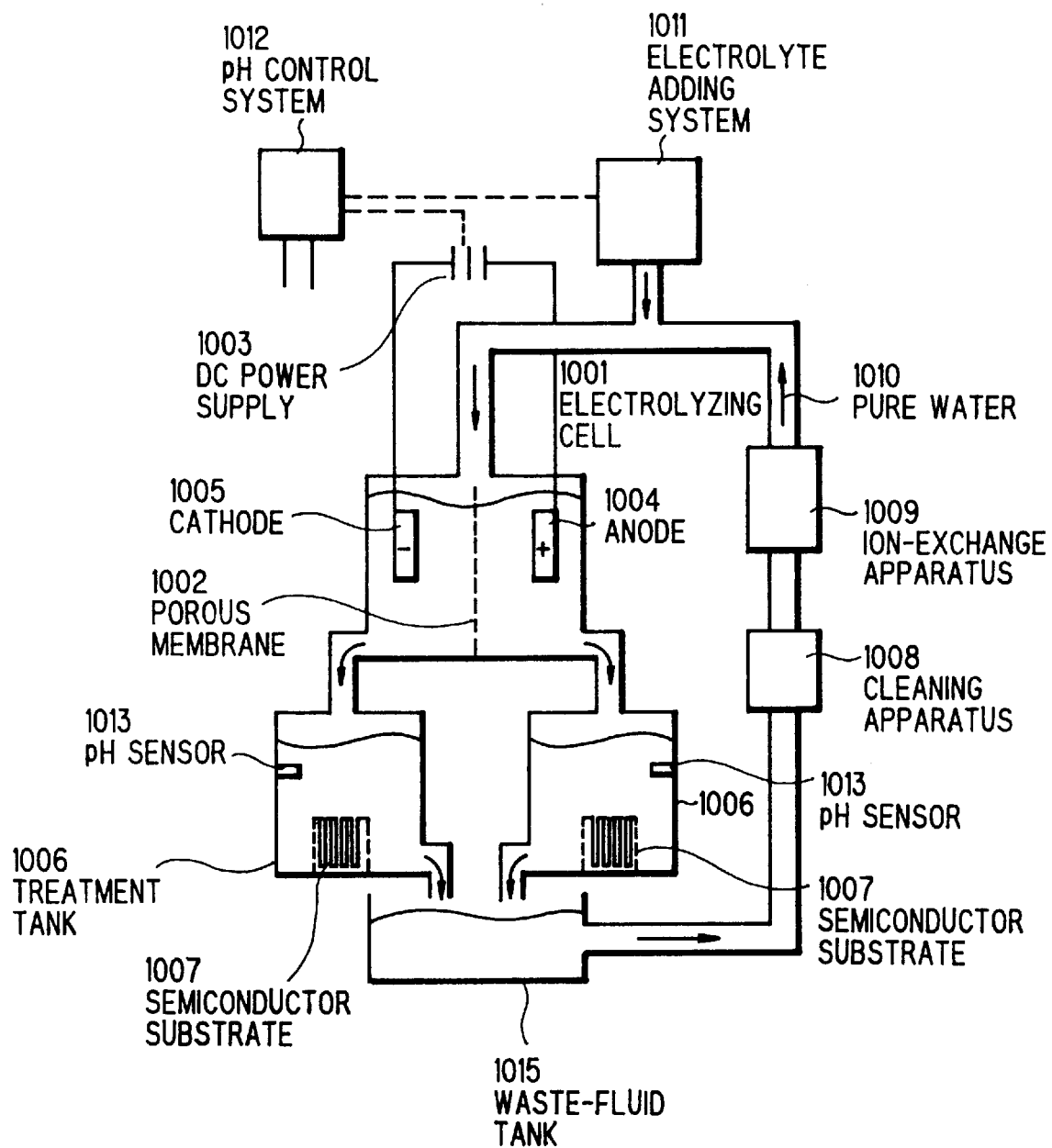
FIG. 2 is an explanatory diagram showing another conventional system for generating electrolyzed water.

FIG. 2 shows another conventional system for wet-processing of semiconductor substrates, using $H^+$ ion water and $OH^-$ ion water produced by electrolyzing water, described in Japanese Patent Publication kokai Heisei 5-105991. The system includes an electrolyzing cell 1001 separated by a porous membrane 1002, a DC power supply 1003, anode and cathode electrodes 1004 and 1005 connected to the DC power supply 1003, two treatment tanks 1006 connected to the electrolyzing cell 1001, a cleaning apparatus 1008 connected to the treatment tanks 1006, an ion-exchange apparatus 1009 connected to the cleaning apparatus 1008, an electrolyte adding system 1011 and a pH control system 1012. Each of the treatment tanks 1006 is provided with a pH sensor 1013 connected to the pH control system 1012. Semiconductor substrates to be cleaned are put in the treatment tanks 1006. From the electrolyte adding system 1011, there is provided chemical material comprising a combination of tetra-alkylammonium and a cation other than halogen.

In operation, when a DC voltage is applied from the DC power supply 1003 to the anode and cathode electrodes 1004 and 1005, acidic water and alkaline water is generated around the anode and cathode electrodes 1004 and 1005, respectively. The semiconductor substrates 1007 in the treatment tanks 1006 are wet-processed with the electrolyzed water therein. The used solution is supplied through a waste-fluid tank 1015 so as to skim the supernatant fluid to be cleaned by the cleaning apparatus 1008. The cleaned water passes through the ion-exchange apparatus 1009 to make pure water 1010 to be recycled to the electrolyzing cell 1001. The pH sensors 1003 sense pH in the treatment tanks 1006, and their output signals are supplied to the pH control system 1012 to control pH in the treatment tanks 1006 by adjusting the amount of electrolyte to be provided from the electrolyte adding system 1011. According to the system, metal contamination, colloidal silica and the like deposited on the semiconductor substrates 1007 are removed.

Figure 3:
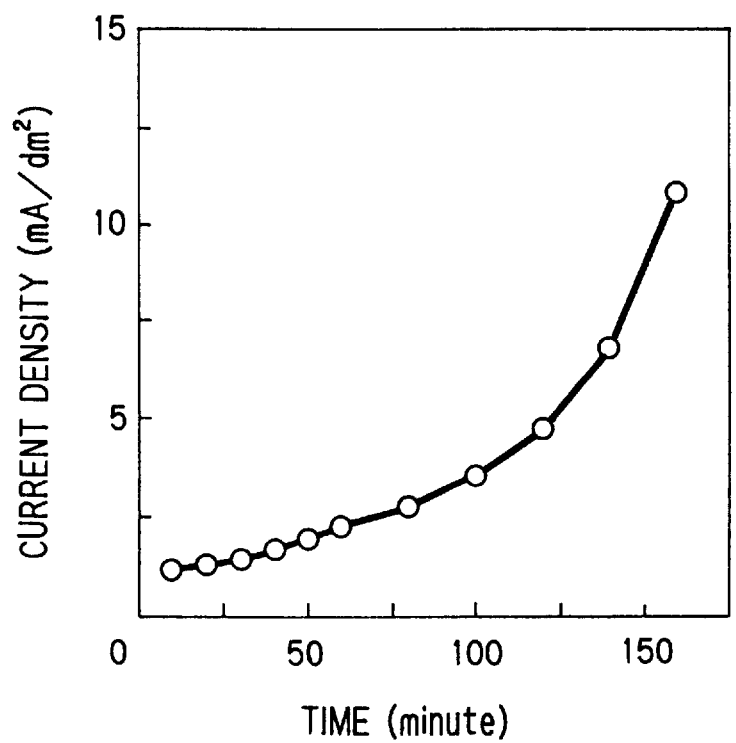
FIG. 3 is a graph showing the relation between time and current density in an electrolysis cell.

FIG. 3 shows the relationship between time and the density of electric current in water under conditions where pure water is put into twin electrolyzing cells to electrolyze the water without flowing of the water. In this test, anode and cathode electrodes are platinum, the space between the two electrodes is 3 mm and 100V of voltage is applied between the electrodes. As shown in FIG. 3, the density of current is 1 mA/dm$^2$ at the beginning and is increased as time, goes by and it becomes more than ten times as much after 160-minutes of electrolysis because the resistance of the water is decreased by ions generated. After that, if the voltage is decreased to 10V, the current density becomes about 1 mA/dm$_2$, which means that water which has been electrolyzed once tends to be electrolyzed again easily. Electrolyte which tends to dissociate easily when added to water exhibits a smaller change in resistance as time goes by. For example, if material such as a strong acid or salt from a strong acid and weak base is used as the electrolyte, change in the resistance as time goes by does not occur, not even a small amount thereof, because these types of material have a large dissociation. In contrast, if material of weak alkalinity such as ammonia water or salt produced from a weak base and a weak acid is used as the electrolyte, resistance in the water changes as time goes by when the electrolyte is added in the water at a concentration of ten to one hundred times that of strong acid. Eventually, if pure water has been electrolyzed in advance, effective electrolysis of the water can be carried out with lower voltage. The invention is created based on the above described theory.

Figure 4:
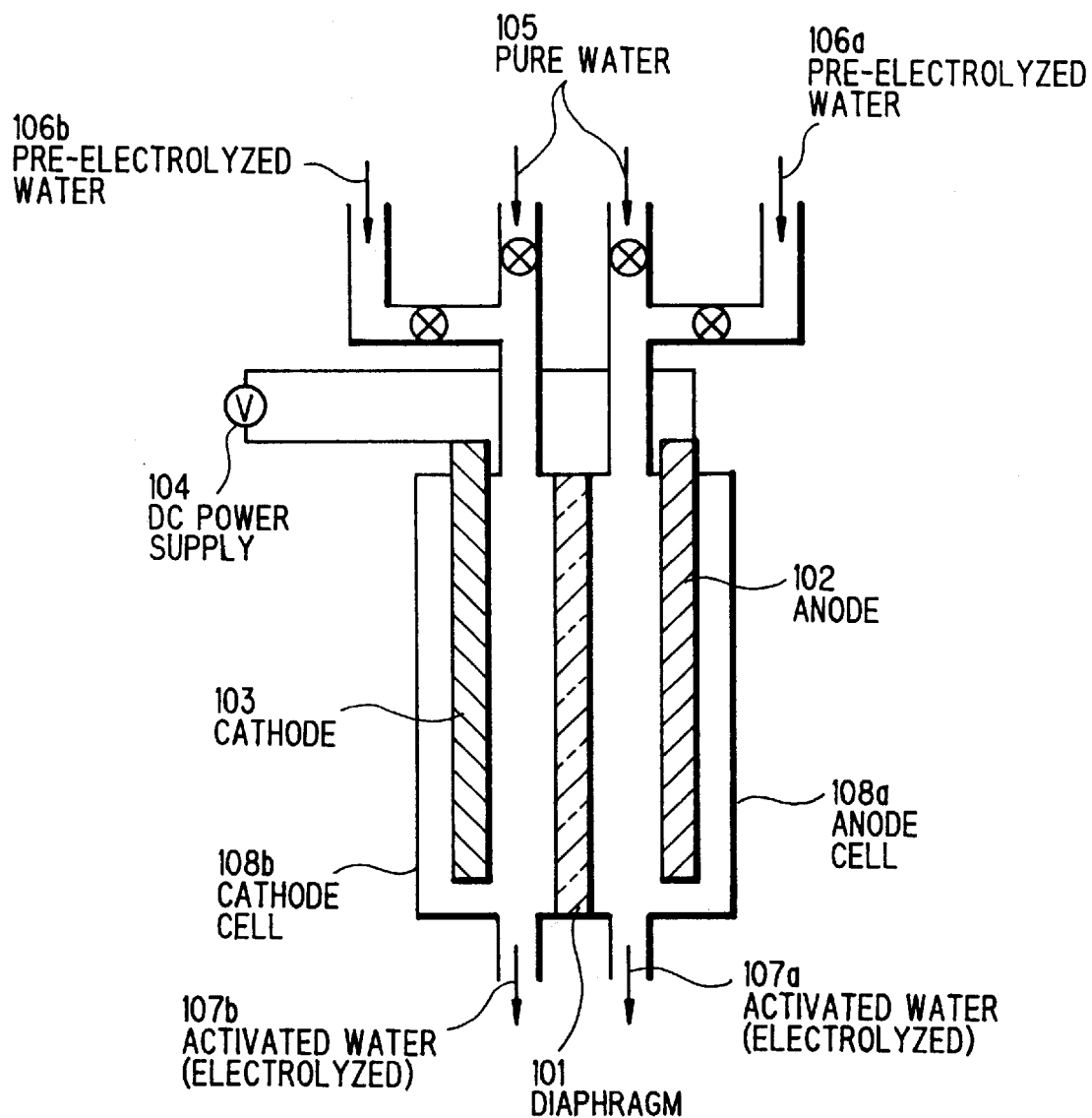
FIG. 4 is an explanatory diagram showing a system for generating electrolyzed water of a first preferred embodiment according to the invention.

FIG. 4 shows a twin-cell type of system of a first preferred embodiment according to the invention, which includes a DC power supply 104, anode and cathode electrodes 102 and 103 connected to the DC power supply 104, anode and cathode cells 108a and 108b into which the anode and cathode electrodes 102 and 103 are inserted, and a diaphragm 101 separating the anode and cathode cells 108a and 108b from each other. Both pure water 105 (or regenerated water) and pre-electrolyzed water 106a are supplied into the anode cell 108a, and both pure water 105 (or regenerated water) and pre-electrolyzed water 106b are supplied into the cathode cell 108b. In this system, if regenerated water is used, the system operates more economically. Further, if regenerated water is used, regenerated water generated from electrolyzed water in the anode cell 108a and the cathode cell 108b is circulated to the anode cell 108a and the cathode cell 108b, respectively. The pre-electrolyzed water 106a and 106b may be generated from water electrolyzed by high voltage, and be mixed with the pure water 105. Activated (electrolyzed) water 107a and 107b is measured in activation by pH and oxidation-reduction potential. If the same level of pH and oxidation-reduction potential is required to be obtained, 10% of pre-electrolyzed water is added to the pure water without electrolyte, so that six to eight times more activated water can be obtained then when no per-electrolyzed water is added.

Pre-electrolyzed water may be added to one of the anode and cathode cells 108a and 108b. If the pre-electrolyzed water 106a and 106b are added to the pure water 105 only at the beginning of electrolysis processing, activated water can be obtained three times as fast as the case of not adding pre-electrolyzed water. In a of flowing type system such as shown in FIG. 4, electrolyzed water having lower resistance contributes to electrolyzing of water located in the portions of the cells rather than the upper cell portions.

If the system is used for semiconductor wet-processing, the material of the electrodes is restricted. That is, for improving efficiency of activation of water, it is preferable to minimize oxygen gas and hydrogen gas. It is preferable to use material having a large oxygen-overvoltage, which is the difference between logical voltage and practically necessary voltage for oxygen gas, and a large hydrogen-overvoltage, which is the difference between logical voltage and practically necessary voltage for hydrogen gas. As shown on page 190 in a book "Oxidation and Reduction" by Kenichi Morinaga, 1979, from Shokabo, material for an electrode having a large oxygen-overvoltage, a platinum or a carbon system is described, and material for an electrode having a large hydrogen-overvoltage, a mercury or a carbon system is described. In the present invention, platinum and graphite-carbon are used for anode and cathode electrodes, respectively. If water which has been electrolyzed in one of the anode and cathode cells is used for wet-treatment, the electrode in the other cell may be made of material having lower overvoltage, such as $Ru_2O$ system for the anode and platinum for the cathode.

Figure 5:
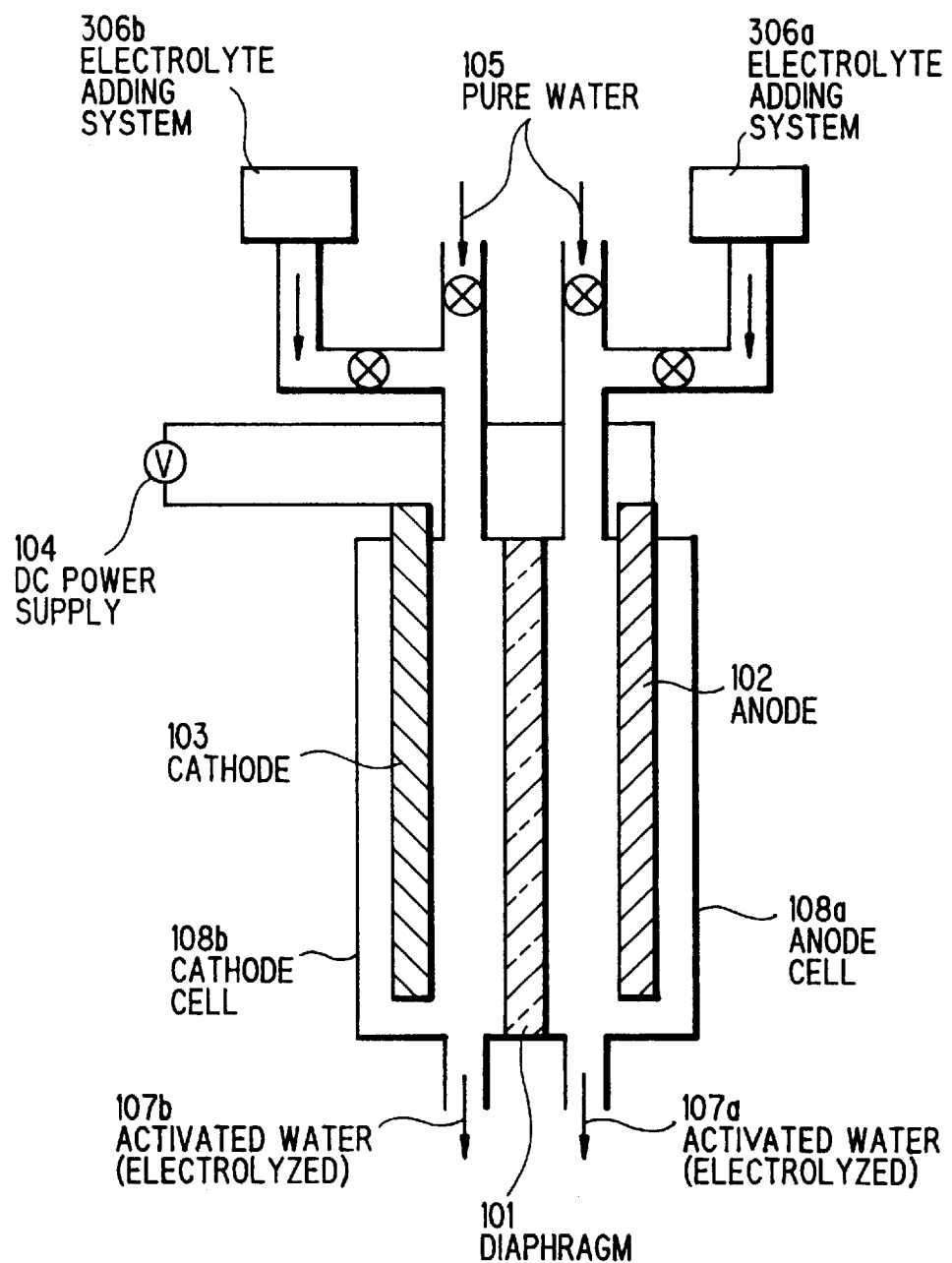
FIG. 5 is an explanatory diagram showing a system for generating electrolyzed water of a second preferred embodiment according to the invention.

FIG. 5 shows a system of a second preferred embodiment according to the invention, which is basically similar to the first preferred embodiment. The system includes a DC power supply 104, anode and cathode electrodes 102 and 103 connected to the DC power supply 104, anode and cathode cells 108a and 108b into which the anode and cathode electrodes 102 and 103 are inserted, a diaphragm 101 separating the anode and cathode cells 108a and 108b from each other, and electrolyte adding systems 306a and 306b.

Figure 6:
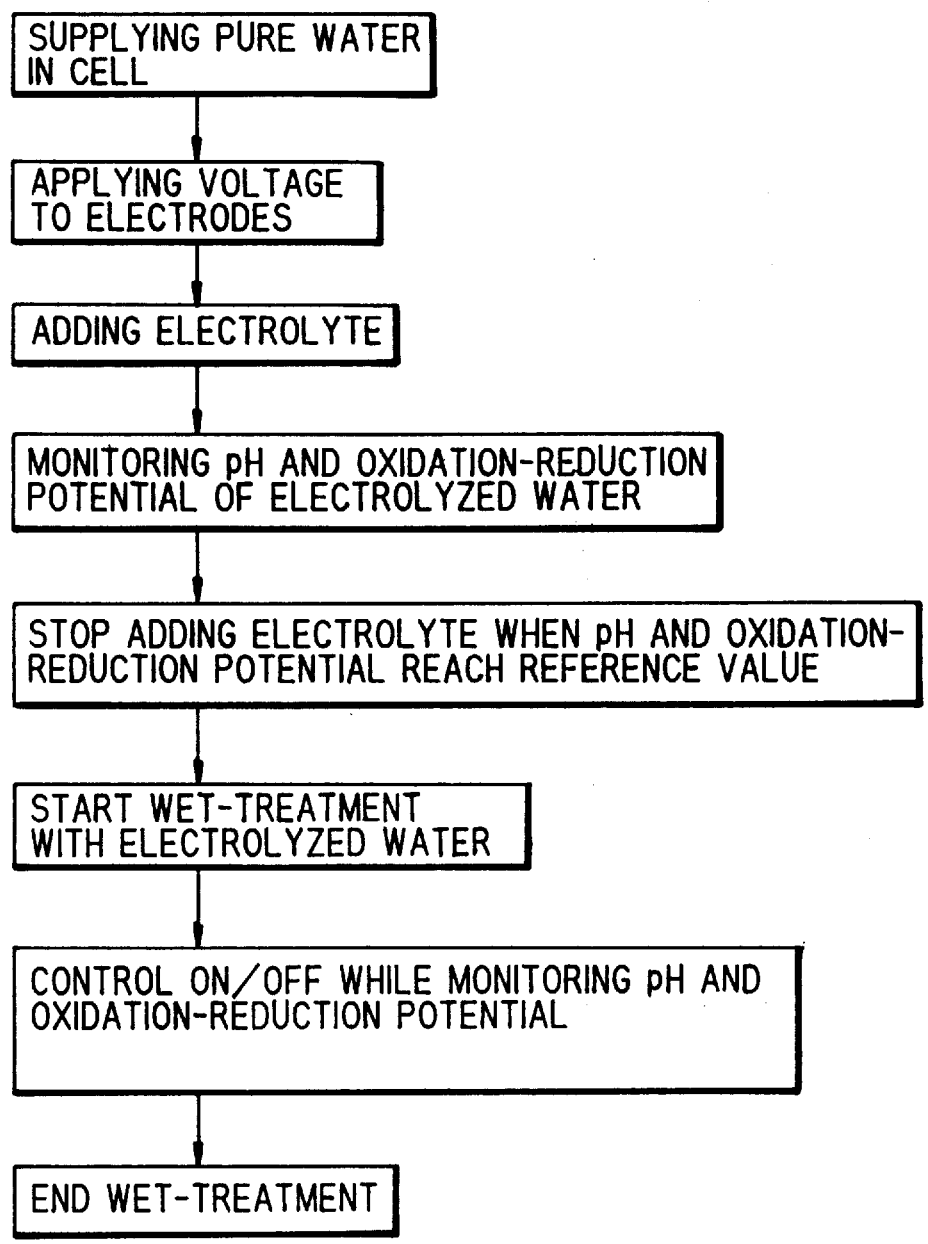
FIG. 6 is a flow chart showing the operation of the second preferred embodiment shown in FIG. 5.

In operation, as shown in FIG. 6, the pure water 105 or regenerated water is supplied into the anode and cathode cells 108a and 108b, then voltage is applied from the DC power supply 104 to the anode and cathode electrodes 102 and 103, and then electrolyte is added into the anode and cathode cells 108a and 108b. The order of the above mentioned three steps can be changed. The water in the cells continues to be electrolyzed while pH and oxidation-reduction potential of the water are monitored. The flowing speed of the water is controlled to be as slow as possible (or stopped if possible) until pH and oxidation-reduction potential reach required values for wet-treatment, and if pH and oxidation-reduction potential of the water reach the required values, the flowing speed of the water is controlled to be appropriate for wet-treatment. When pH and oxidation-reduction potential of the water become get stable, wet-treatment with the electrolyzed water starts. Electrolyte may be added in the water. When 2 milli-mol of ammonium chloride is added as electrolyte to the water at the beginning of the electrolysis processing, four times the electrolysis efficiency can be obtained.

If ammonium chloride and a cation exchange diaphragm of a fluorine system are used for the electrolyte and the diaphragm, respectively, electrolyzed water in the cathode cell 108b tends not to become alkaline easily. If alkaline electrolyzed water is required to be obtained by controlling the characteristics of water in the cathode cell, it is better to use a diaphragm having lower selectivity, through which either cations or anion pass, for better result. If electrolyzed water taken from the anode cell is used for removing metal pieces, it is better to monitor oxidation-reduction potential for better control. On the other hand, when electrolyzed water taken from the cathode cell is used for removing particles or organic pieces or for surface treatment of metal, it is better to monitor pH of the water for better control.

Figure 7:
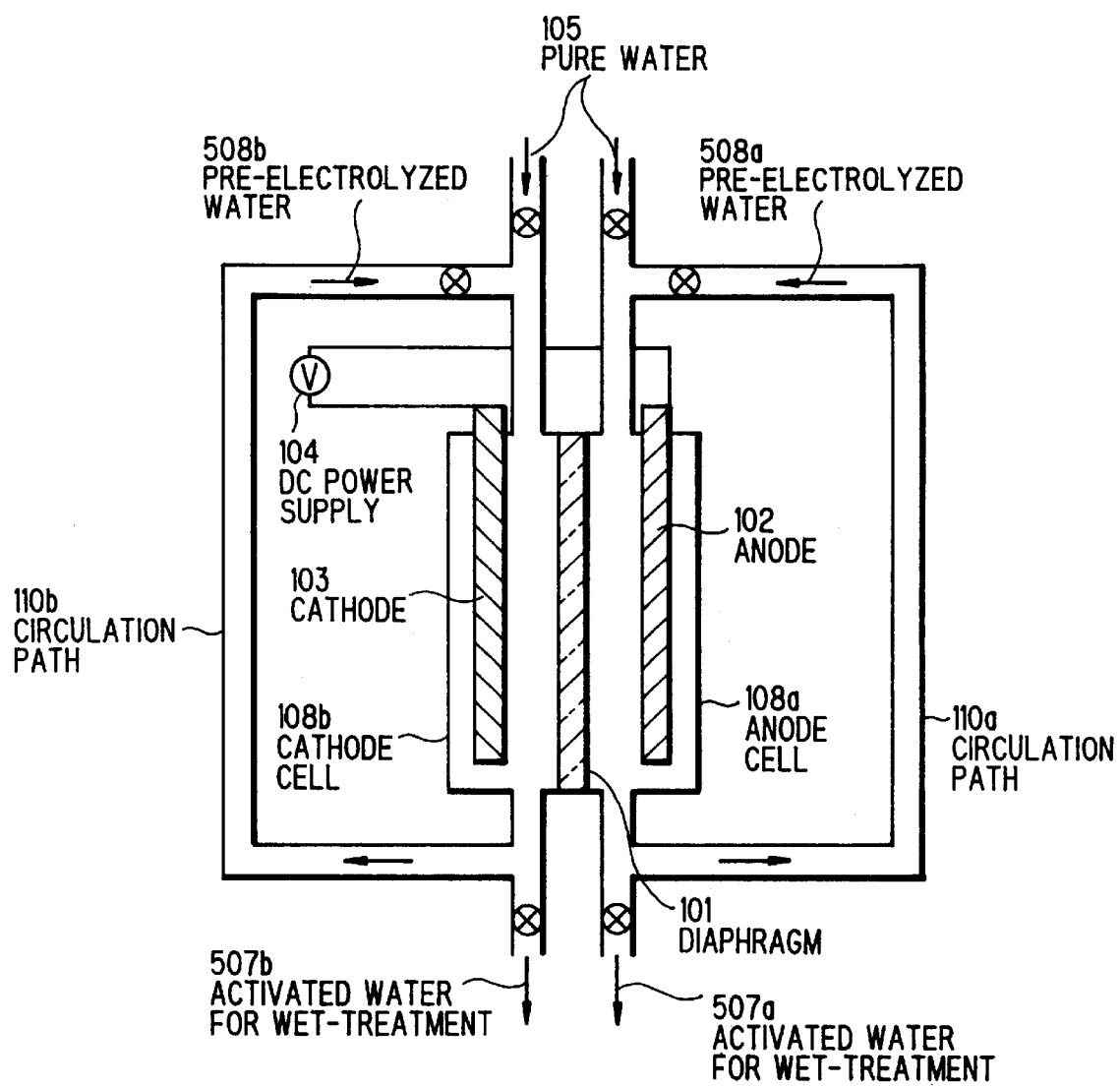
FIG. 7 is an explanatory diagram showing a system for generating electrolyzed water of a third preferred embodiment according to the invention.

FIG. 7 shows a system of a third preferred embodiment according to the invention, which is basically similar to the first and second preferred embodiments shown in FIGS. 4 and 5. The system includes a DC power supply 104, anode and cathode electrodes 102 and 103 connected to the DC power supply 104, anode and cathode cells 108a and 108b into which the anode and cathode electrodes 102 and 103 are inserted, a diaphragm 101 separating the anode and cathode cells 108a and 108b from each other, and circulation paths 110a and 110b.

Most water electrolyzed in the anode and cathode cells 108a and 108b is used as activated water 507a and 507b for wet-treatment, while the other electrolyzed water is circulated, as pre-electrolyzed water 508a and 508b, through circulation paths 110a and 110b to the anode and cathode cells 108a and 108b. The electrolysis cells (anode and cathode cells 108a and 108b) operate as an additional cell for generating the pre-electrolyzed water 508a and 508b. In this system, once stable electrolysis has been established, electrolyzed water having stable characteristics will be generated continuously. Electrolyte may be added to the pure water 105 at the beginning of electrolysis in order to obtain electrolyzed water that has stable characteristics for a short time, as described in the second preferred embodiment. If the electrolyte does not affect wet-treatment, the system may be provided with an electrolyte adding system as shown in FIG. 5. In stable electrolysis, this system generates electrolyzed water ten times as effectively as that generated by conventional technology. At the beginning of electrolysis, more voltage may be applied to the electrodes 102 and 103 in order to shorten the time necessary for reaching stable electrolysis condition.

Figure 8:
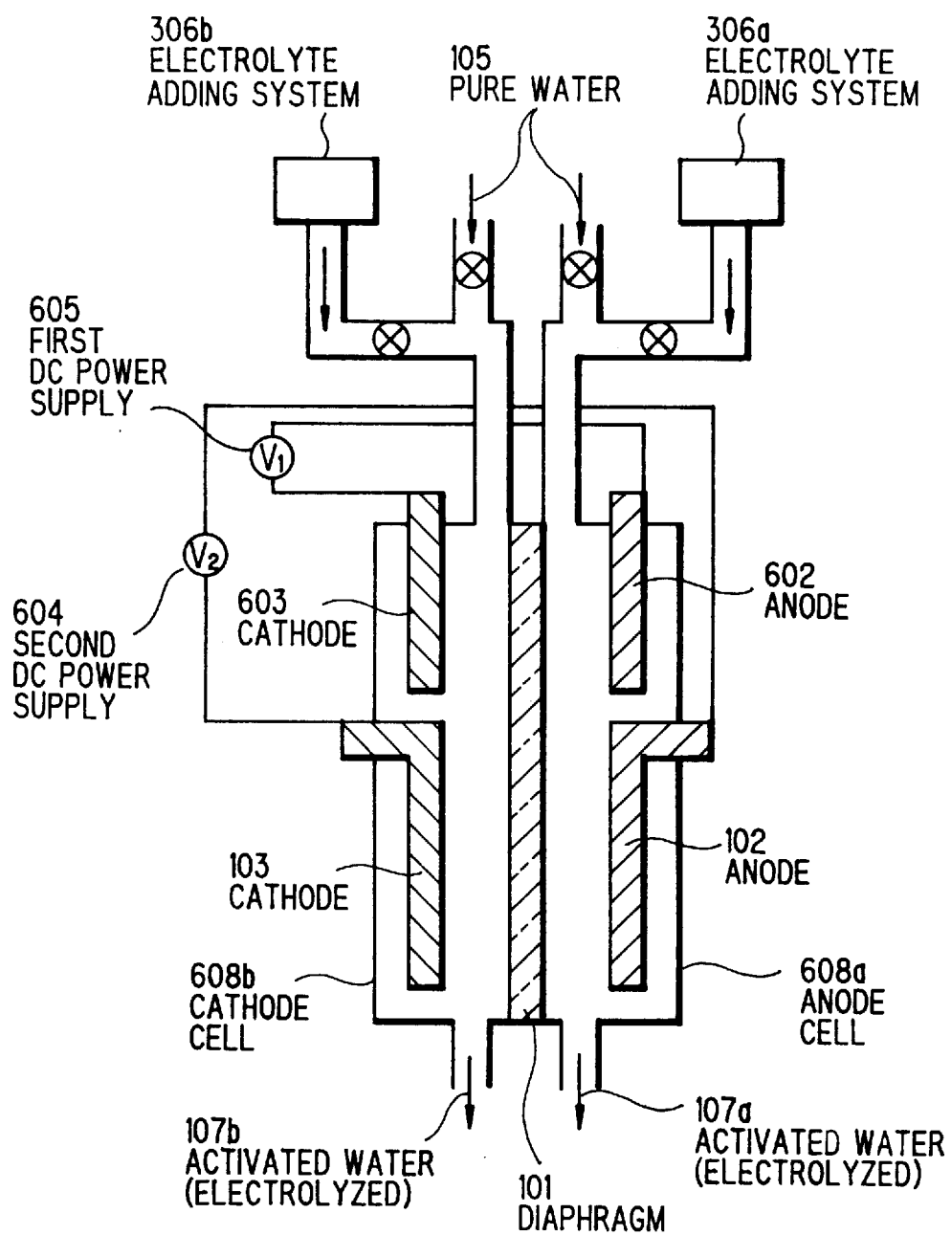
FIG. 8 is an explanatory diagram showing a system for generating electrolyzed water of a fourth preferred embodiment according to the invention.

FIG. 8 shows a system of a fourth preferred embodiment according to the invention, which includes first and second DC power supplies 604 and 605, a lower pair of anode and cathode electrodes 102 and 103 connected to the first DC power supply 604, a upper pair of anode and cathode electrodes 602 and 603 connected to the second DC power supply 605, anode and cathode cells 608a and 608b into which the lower and upper anode electrodes 102 and 602 and the lower and upper cathode electrodes 103 and 603 are inserted, respectively, a diaphragm 101 separating the anode and cathode cells 608a and 608b from each other, and electrolyte adding system 306a and 306b connected to the anode and cathode cells 608a and 608b, respectively. The anode and cathode electrodes 102, 103, 602 and 603 are arranged to have the same distance from the diaphragm 101.

In operation, when pure water 105 (or regenerated water) is supplied to each of the anode and cathode cells 608a and 608b, DC voltage is applied to each electrode. The water is electrolyzed and is supplied as activated water (electrolyzed water) 107a and 107b for wet-treatment of semiconductor substrates. The voltage levels of the first and second DC power supplies 604 and 605 are controlled independently from each other; for example, the second (upper) DC power supply 605 applies a larger voltage for providing a higher electric field relative to the first (lower) DC power supply 604 in order to electrolyze the water efficiently.

Figure 9:
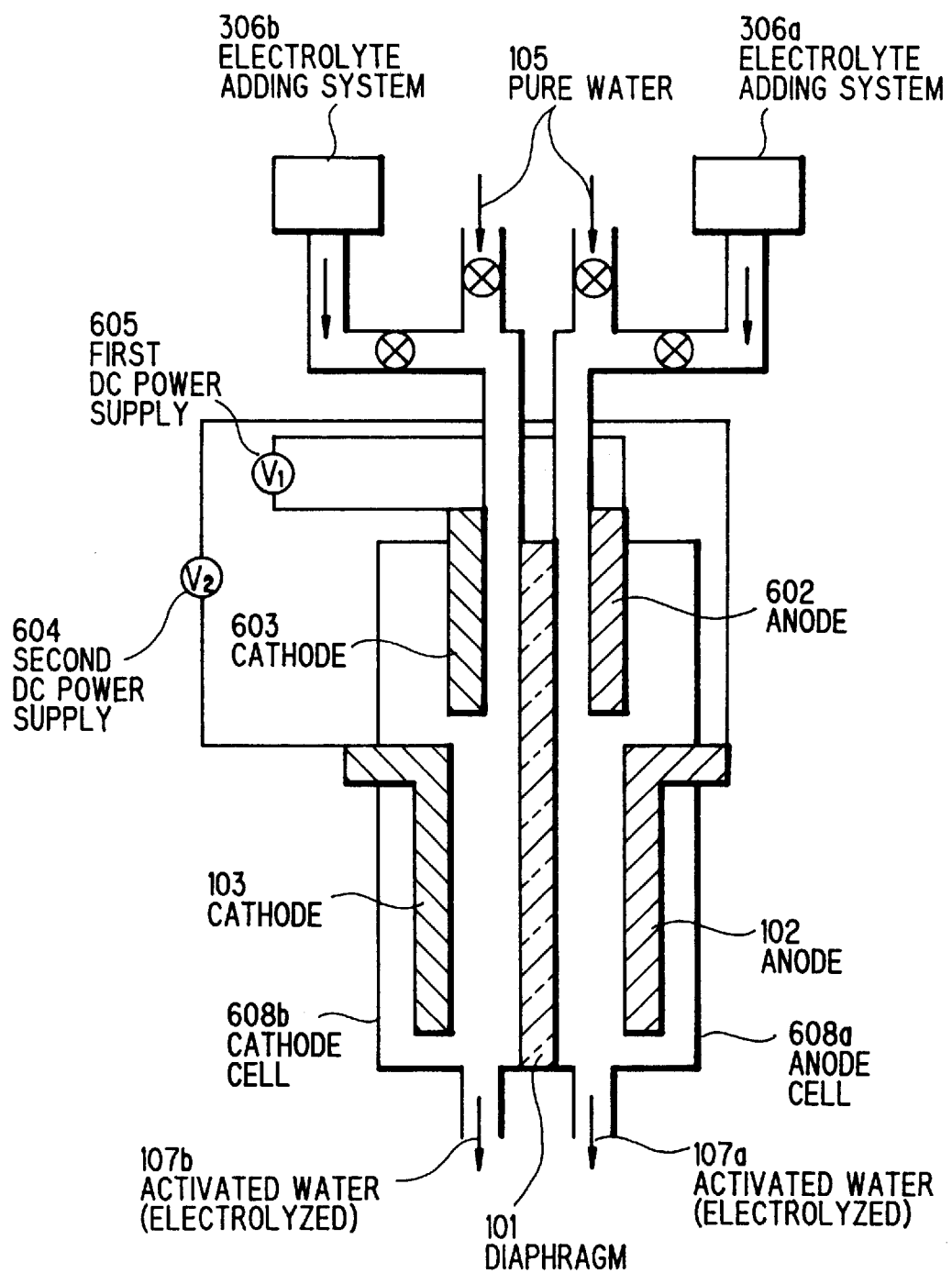
FIG. 9 is an explanatory diagram showing a system for generating electrolyzed water of a fifth preferred embodiment according to the invention.

FIG. 9 shows a system of a fifth preferred embodiment according to the invention, which is basically similar to the system shown in FIG. 8. The system includes first and second DC power supplies 604 and 605, a lower pair of anode and cathode electrodes 102 and 103 connected to the first DC power supply 604, an upper pair of anode and cathode electrodes 602 and 603 connected to the second DC power supply 605, anode and cathode cells 608a and 608b into which the lower and upper anode electrodes 102 and 602 and the lower and upper cathode electrodes 103 and 603 are inserted, respectively, a diaphragm 101 separating the anode and cathode cells 608a and 608b from each other, and electrolyte adding system 306a and 306b connected to the anode and cathode cells 608a and 608b, respectively. The upper pair of anode and cathode electrodes 602 and 603 are arranged to have a narrower distance from the diaphragm 101 as compared to that of the lower pair of anode and cathode electrodes 102 and 103. The first and second DC power supplies 604 and 605 may have the same power providing the same level of DC voltage; further, the first and second DC power supplies 604 and 605 may be combined with each other to form a single power supply. The basic operation of the system is the same as that of the system shown in FIG.8.

Figure 10:
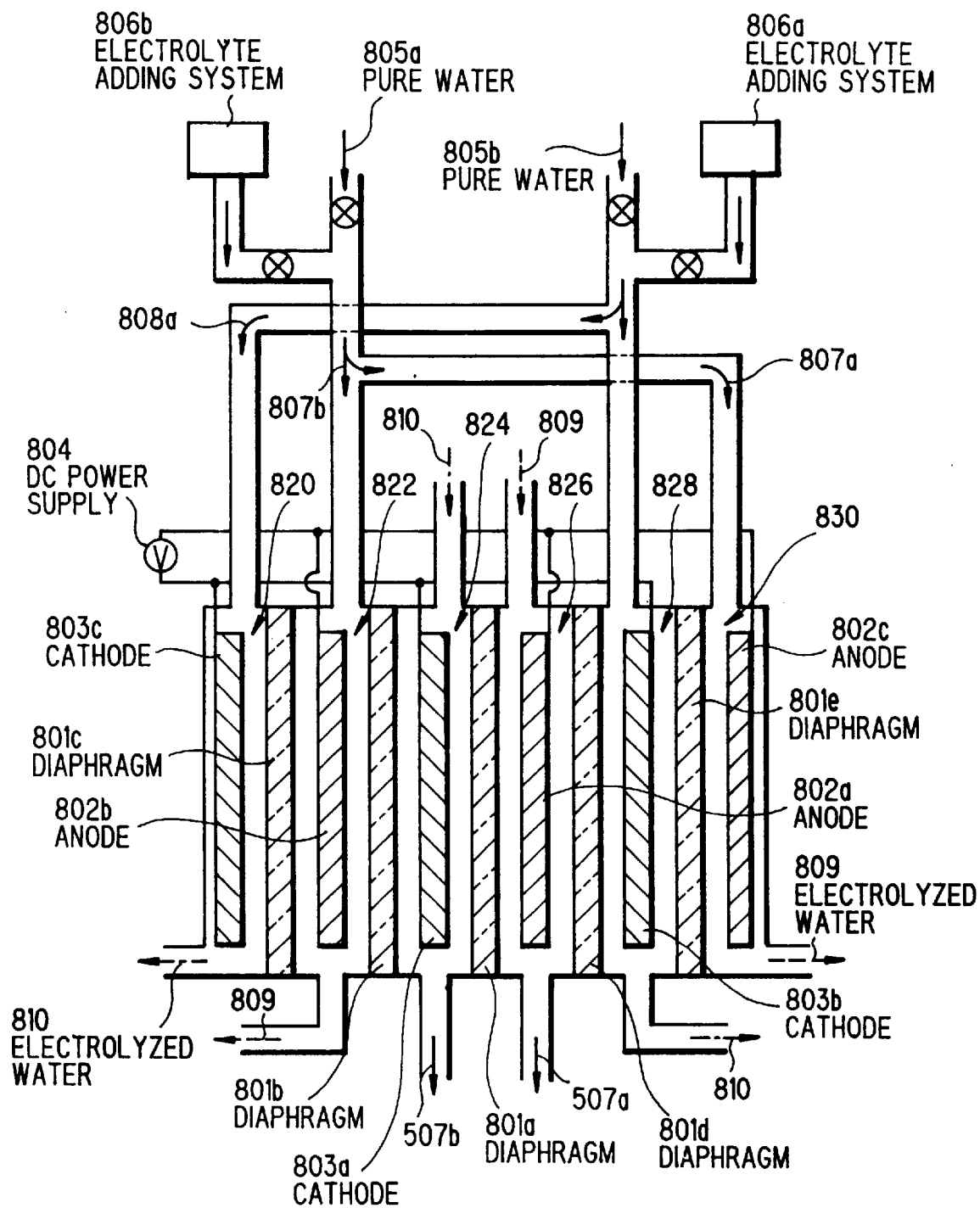
FIG. 10 is an explanatory diagram showing a system for generating electrolyzed water of a sixth preferred embodiment according to the invention.

FIG. 10 shows a sixth preferred embodiment according to the invention, which is of six-cell type. The system includes a DC power supply 804, electrolyte adding systems 806a and 806b, first to third cathode cells 820, 824 and 828a, first to third anode cells 822, 826 and 830, a diaphragm 801c separating the first cathode and anode cells 820 and 822 from each other, a diaphragm 801b separating the first anode cell 822 and the second cathode cell 824 from each other, a diaphragm 801a separating the second cathode cell 824 and the second anode cell 826 from each other, a diaphragm 801d separating the second anode cell 826 and the third cathode cell 828 from each other, a diaphragm 801e separating the third cathode cell 828 and the third anode cell 830 from each other, first to third cathode electrodes 803c, 803a, 803b inserted in the first to third cathode cells 820, 824 and 828, respectively, and first to third anode electrodes 802b, 802a, 802c inserted in the first to third anode cells 822, 826 and 830, respectively. The DC power supply 804 is connected to each electrode.

In the system, only the anode 802a and the cathode 803a are used to generate electrolyzed active water 507a and 507b to be used for wet-treatment. The other electrodes are used to generate electrolyzed water 809 and 810 to be circulated into the second cathode and anode cells 824 and 826. Pure water (or regenerated water) 805a and 805b are supplied to the anode cells 822 and 830, and 820 and 828, respectively. Electrolyte is added into the pure water 805a and 805b only at the beginning of electrolysis; however, it is not necessary to add the electrolyte into the pure water 805a and 805b. Both the side surfaces of the cathode electrode 803a and both the side surfaces of the anode electrode 802a contribute to electrolyze the pure water 805a and 805b, so that the water can be electrolyzed more efficiently than that of the other systems shown in FIGS. 4, 5, 7, 8 and 9.

The system can be provided with another DC power supply for generating pre-electrolyzed water. The distance of each electrode, especially 802b and 803b (803b and 802c), from the corresponding diaphragm can be changed. Each of the diaphragms 801a to 801e is made of fluoric cation-exchange membrane. The electrolysis processing is carried out at 40V of voltage while each distance of electrode is 3 mm. When trying to generate electrolyzed water having pH down to 5 and oxidation-reduction potential 700 mV in the anode side (826), this system generates electrolyzed water 10 times as much as that by a conventional system without using spare electrodes. When trying to generate electrolyzed water having pH of up to 9 and oxidation-reduction potential −500 mV in the cathode side (824), this system generates electrolyzed water 8 times as much as that by the conventional system. It is easier to generate reduction water (507b), so that more electrolyzed water can be generated at the cathode side (824). If a small amount of electrolyte is added in the pure water 805a and 805b, more stable electrolyzed water can be generated.

Figure 11:
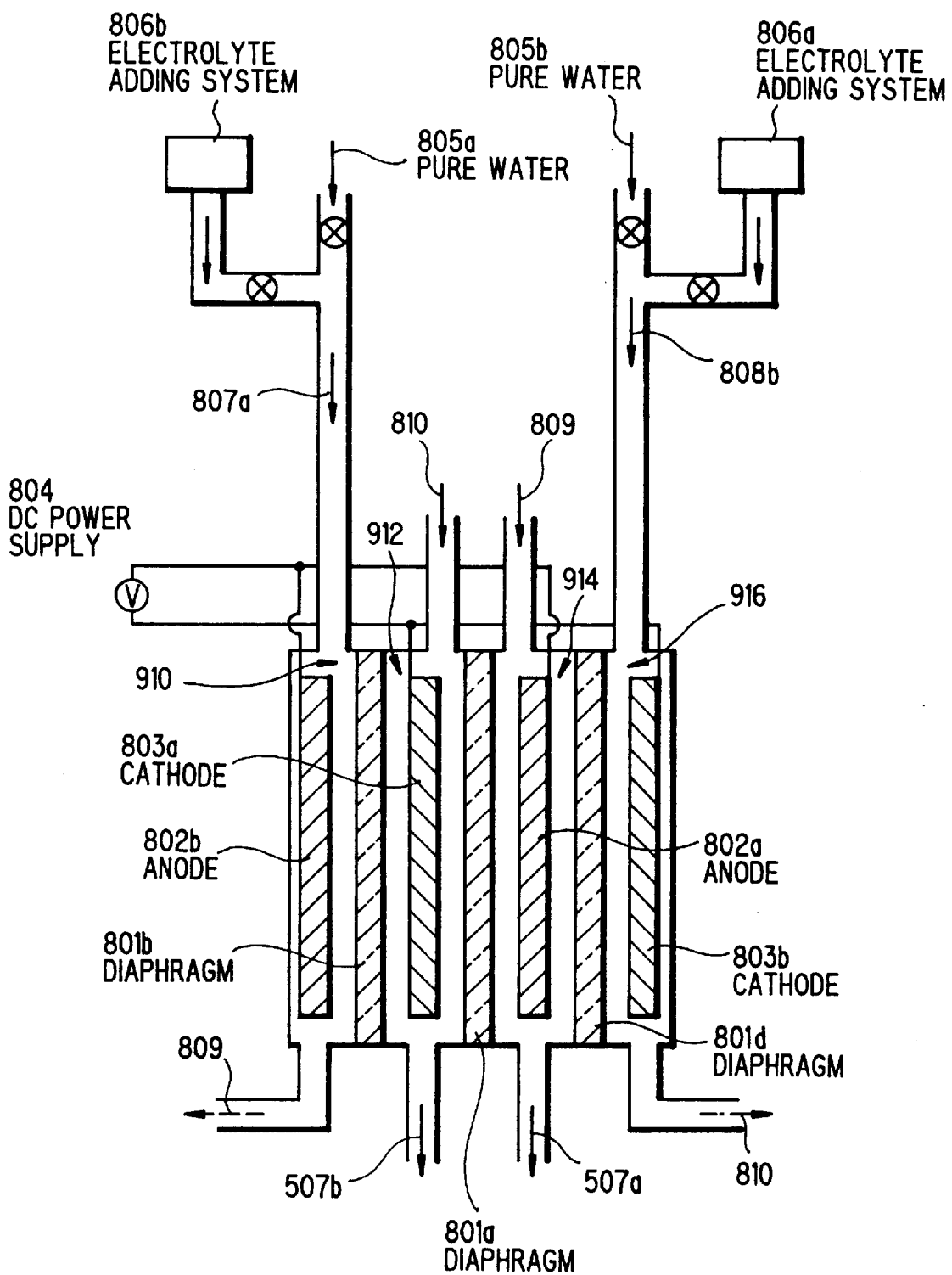
FIG. 11 is an explanatory diagram showing a system for generating electrolyzed water of a seventh preferred embodiment according to the invention.

FIG. 11 shows a seventh preferred embodiment according to the invention, which basically has the same concept as the system shown in FIG. 10. That is, the system shown in FIG. 11 is of four-cell type, rather than six-cell type. The system includes a DC power supply 804, electrolyte adding systems 806a and 806b, first and second anode cells 910 and 914, first and second cathode cells 912 and 916, a diaphragm 801b separating the first anode and cathode cells 810 and 912 from each other, a diaphragm 801a separating the first cathode cell 912 and the second anode cell 914 from each other, a diaphragm 801d separating the second anode cell 914 and the second cathode cell 916 from each other, first and second anode electrodes 802b and 802a inserted in the first and second anode cells 910 and 914, respectively, and first and second cathode electrodes 803a and 803b inserted in the first and second cathode cells 912 and 916, respectively. The DC power supply 804 is connected to each electrode.

According to the invention, it is not necessary to add electrolyte to the water to be electrolyzed after electrolysis conditions become stable. That is, stable electrolysis can be carried out without controlling the amount of electrolyte added in water.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. A method for generating electrolyzed water, comprising the steps of:
   providing water in a container separated by a diaphragm into anode and cathode cells;
   electrolyzing the water by applying a voltage to an anode electrode located in the anode cell and a cathode electrode located in the cathode cell;
   adding pre-electrolyzed solution to the water in the anode cell and to the water in the cathode cell at least at the beginning of the electrolyzing step;
   returning only a portion of a first activated water that has been electrolyzed in the anode cell to an upper portion of the anode cell; and
   returning only a portion of a second activated water that has been electrolyzed in the cathode cell to an upper portion of the cathode cell.

2. The method according to claim 1, wherein:
   the pre-electrolyzed solution is continuously added to the water until the electrolysis becomes steady.

3. The method according to claim 1, wherein:
   the pre-electrolyzed solution is continuously added to the water.

4. The method according to claim 1, further comprising the step of:
   adding electrolyte to the water at least at the beginning of the electrolyzing step.

5. The method according to claim 4, wherein:
   the electrolyte is continuously added to the water until the electrolysis becomes steady.

6. A method for generating electrolyzed water, comprising the steps of:
    providing water in a first container separated by a diaphragm into anode and cathode cells;
    electrolyzing the water by applying a voltage to an anode electrode located in the anode cell and a cathode electrode located in the cathode cell;
    adding pre-electrolyzed solution to the water in the anode cell and to the water in the cathode cell respectively at least at the beginning of the electrolyzing step;
    returning only a portion of a first activated water that has been electrolyzed in the anode cell of the first container to an upper portion of an anode cell of a second container; and
    returning only a portion of a second activated water that has been electrolyzed in the cathode cell of the first container to an upper portion of a cathode cell of the second container.

7. The method according to claim 6, wherein:
    the pre-electrolyzed solution is continuously added to the water until the electrolysis becomes steady.

8. The method according to claim 6, wherein:
    the pre-electrolyzed solution is continuously added to the water.

9. The method according to claim 6, further comprising the step of:
    adding electrolyte to the water at least at the beginning of the electrolyzing step.

10. The method according to claim 9, wherein:
    the electrolyte is continuously added to the water until the electrolysis becomes steady.

* * * * *